(12) United States Patent
Chang et al.

(10) Patent No.: US 10,273,141 B2
(45) Date of Patent: Apr. 30, 2019

(54) ROUGH LAYER FOR BETTER ANTI-STICTION DEPOSITION

(71) Applicant: Taiwan Semiconductor Manufacturing Co., Ltd., Hsin-Chu (TW)

(72) Inventors: Chih-Hang Chang, Taoyuan (TW); I-Shi Wang, Sanxia Township (TW); Jen-Hao Liu, Zhunan Township (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/138,419

(22) Filed: Apr. 26, 2016

(65) Prior Publication Data

US 2017/0305738 A1 Oct. 26, 2017

(51) Int. Cl.
*B81B 3/00* (2006.01)
*B81C 1/00* (2006.01)

(52) U.S. Cl.
CPC ............ *B81B 3/0005* (2013.01); *B81B 3/001* (2013.01); *B81B 2207/012* (2013.01); *B81C 2201/112* (2013.01); *B81C 2201/115* (2013.01)

(58) Field of Classification Search
CPC .... B81B 2203/0127; B81B 2203/0315; B81B 3/0005; B81B 2201/0235; B81B 2207/012; B81B 3/001; B81B 7/008; B81B 2203/04; B81B 2207/07; B81B 7/007; B81B 7/0077; B81B 7/02; B81B 2207/096; B81B 2201/0264; B81B 2207/098; B81B 7/0006; B81B 7/0064; B81C 1/00968; B81C 2201/112; B81C 1/00984; B81C 2203/0109; B81C 2203/0118; B81C 2203/035; B81C 2203/036; B81C 2203/0785; B81C 2203/0792; B81C 1/0023; B81C 1/00238; B81C 2201/0132; B81C 2203/037; B81C 1/00269; B81C 2203/019; B81C 2203/054; B81C 2203/0735; B81C 2203/075; B81C 3/005; B81C 3/008; B81C 1/00476; B81C 1/00301; B81C 2201/013; B81C 2203/031; H01L 2924/1461

See application file for complete search history.

(56) References Cited

U.S. PATENT DOCUMENTS

| | | | |
|---|---|---|---|
| 6,753,201 B2 * | 6/2004 | Muto | ..................... B81C 1/0019 257/E21.549 |
| 8,987,059 B2 | 3/2015 | Liang et al. | |
| 9,040,334 B2 | 5/2015 | Chu et al. | |
| 9,065,358 B2 | 6/2015 | Tsai et al. | |

(Continued)

*Primary Examiner* — Mark W Tornow
*Assistant Examiner* — Priya M Rampersaud
(74) *Attorney, Agent, or Firm* — Eschweiler & Potashnik, LLC

(57) ABSTRACT

A microelectromechanical systems (MEMS) package with roughness for high quality anti-stiction is provided. A device substrate is arranged over a support device. The device substrate comprises a movable element with a lower surface that is rough and that is arranged within a cavity. A dielectric layer is arranged between the support device and the device substrate. The dielectric layer laterally encloses the cavity. An anti-stiction layer lines the lower surface of the movable element. A method for manufacturing the MEMS package is also provided.

20 Claims, 7 Drawing Sheets

(56) References Cited

U.S. PATENT DOCUMENTS

| | | |
|---|---|---|
| 9,085,455 B2 | 7/2015 | Cheng et al. |
| 9,085,456 B2 | 7/2015 | Tsai et al. |
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |
| 2004/0248344 A1* | 12/2004 | Partridge ............ B81C 1/00333 438/127 |
| 2005/0095833 A1* | 5/2005 | Lutz ..................... B81B 3/0005 438/597 |
| 2010/0065946 A1* | 3/2010 | Wilson ................ B81C 1/00952 257/618 |
| 2013/0043510 A1* | 2/2013 | Shu ..................... B81C 1/00269 257/254 |
| 2014/0227817 A1* | 8/2014 | Chien ................... B81C 1/0023 438/51 |
| 2014/0287548 A1* | 9/2014 | Lin ..................... B81C 1/00333 438/50 |
| 2015/0035089 A1* | 2/2015 | Liu ........................... B81B 7/02 257/415 |
| 2015/0102437 A1* | 4/2015 | Liu ...................... B81B 3/0021 257/419 |
| 2015/0137303 A1 | 5/2015 | Chou et al. |
| 2015/0158716 A1* | 6/2015 | Cheng ................... B81B 3/0005 257/254 |
| 2015/0175405 A1 | 6/2015 | Cheng |
| 2015/0175407 A1 | 6/2015 | Cheng et al. |
| 2015/0196912 A1 | 7/2015 | Tsai et al. |
| 2016/0107881 A1* | 4/2016 | Thompson ............ B81B 7/0064 257/418 |
| 2016/0318757 A1* | 11/2016 | Chou ................... B81C 1/00595 |
| 2016/0318758 A1* | 11/2016 | Chou ................... B81C 1/00619 |
| 2016/0332863 A1* | 11/2016 | Cheng ................... B81B 3/0005 |

\* cited by examiner

ROUGH LAYER FOR BETTER ANTI-STICTION DEPOSITION

BACKGROUND

Microelectromechanical systems (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
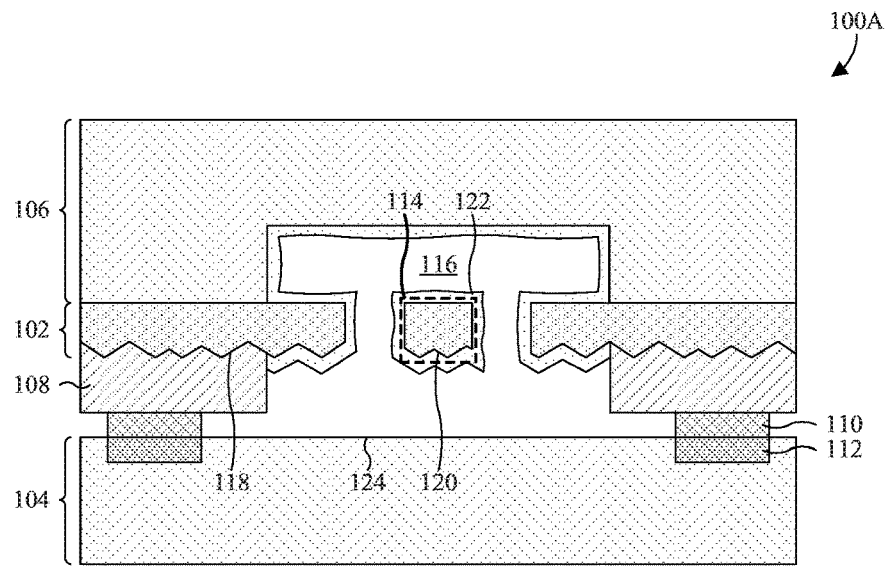
FIG. 1A illustrates a cross-sectional view of some embodiments of a microelectromechanical systems (MEMS) package with roughness for high quality anti-stiction.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some microelectromechanical systems (MEMS) devices, such as accelerometers, gyroscopes, and pressure sensors, comprise a movable element and neighboring sensing electrodes arranged within a cavity. The movable element is configured to move in proportion to external stimuli, such as acceleration, pressure, or gravity. The sensing electrodes are configured to sense the extent of the movement using capacitive coupling with the movable element.

A challenge with the MEMS devices is stiction. When the movable element moves to such an extreme that it interfaces with surfaces of the cavity, the movable element may stick to the surfaces of the cavity. Such stiction reduces the sensitivity of the MEMS devices and reduces the lifetimes of the MEMS devices. A solution to stiction is to coat surfaces of the cavity and/or surfaces of the movable element with an anti-stiction layer. The anti-stiction layer may be formed by a reaction between perfluorodecyltrichlorosilane (FDTS) and hydroxide on the surfaces. However, the reaction is often performed without heat and without plasma, such that the quality of the reaction is dependent upon collisions of the FDTS with the surfaces. Given that the surfaces of the cavity and/or the movable element are often flat and arranged at 90 degree angles relative to one another, the surface area with which the FDTS may contact the hydroxide may be minimal and the quality of the reaction may be poor. Poor reaction quality leads to an anti-stiction layer with poor thickness uniformity and/or poor coverage.

The present application is directed to a MEMS package with roughness for high quality anti-stiction. In some embodiments, a device substrate is arranged over a support device and covered by a capping device. The device substrate comprises a movable element arranged within a cavity between the support and capping devices, and the movable element comprises a rough surface. An anti-stiction layer lines the rough surface and other surfaces of the device substrate and the capping device within in the cavity.

Advantageously, the likelihood of stiction between surfaces of the cavity and the rough surface of the movable element is low due to the roughness of the rough surface. The roughness (by way of peaks and valleys) minimizes the surface area of the rough surface that may interface with the surfaces of the cavity. Further, where the anti-stiction layer is formed by FDTS, the roughness increases the surface area to which FDTS may contact hydroxide on the movable element, thereby increasing the quality of the anti-stiction layer. Even more, the MEMS package can be formed without additional masks (which add cost), and without affecting bond interfaces between the device substrate and the capping and support devices.

With reference to FIG. 1A, a cross-sectional view 100A of some embodiments of a MEMS package with roughness for high quality anti-stiction is provided. As illustrated, a MEMS device substrate 102 is arranged over a support device 104 and covered by a capping device 106. The MEMS device substrate 102 is bonded to the support and capping devices 104, 106, and spaced from the support device 104 by an inter-substrate dielectric (ISD) layer 108. In some embodiments, the MEMS device substrate 102 is fusion bonded to the capping device 106 and/or eutectically bonded to the support device 104 through respective bond rings 110, 112 of the MEMS device substrate 102 and the support device 104. Further, in some embodiments, the support and/or the capping devices 104, 106 are integrated circuits (ICs).

A movable element 114 (e.g., a proof mass) of the MEMS device substrate 102 is suspended within a cavity 116 defined between the support and capping devices 104, 106, and is configured to move within the cavity 116 in proportion to external stimuli, such as acceleration. A lower surface 118 of the MEMS device substrate 102, including a lower surface 120 of the movable element 114, is rough within the cavity 116. For example, the lower surface 118 of the MEMS device substrate 102 may have a saw tooth profile and/or peaks and valleys of varying size within the cavity 116. As such, the MEMS device substrate 102 may, for example, also be referred to as a rough layer. An anti-stiction layer 122 is arranged in the cavity 116, and lines surfaces of the capping device 106 and the MEMS device substrate 102 within the cavity 116, including the movable element lower surface 120.

Roughness on the movable element lower surface 120 advantageously reduces the likelihood of stiction between the movable element 114 and an upper surface 124 of the support device 104. The roughness reduces the amount of surface area on the movable element lower surface 120 that can come into contact with the support device upper surface 124. For example, if the movable element 114 moves towards the support device upper surface 124, the largest protrusion of the movable element lower surface 120 is going to interface with the support device upper surface 124 first and prevent other regions on the movable element lower surface 120 from interfacing with and sticking to the support device upper surface 124. Further, where the anti-stiction layer 122 is formed using a reaction between FDTS and hydroxide, roughness on the movable element lower surface 120 advantageously increases the surface area for the reaction and hence the quality of the anti-stiction layer 122 on the movable element lower surface 120. As such, a thickness of the anti-stiction layer 122 is more uniform on the movable element lower surface 120 than it is on other flat surfaces.

Figure 1B:
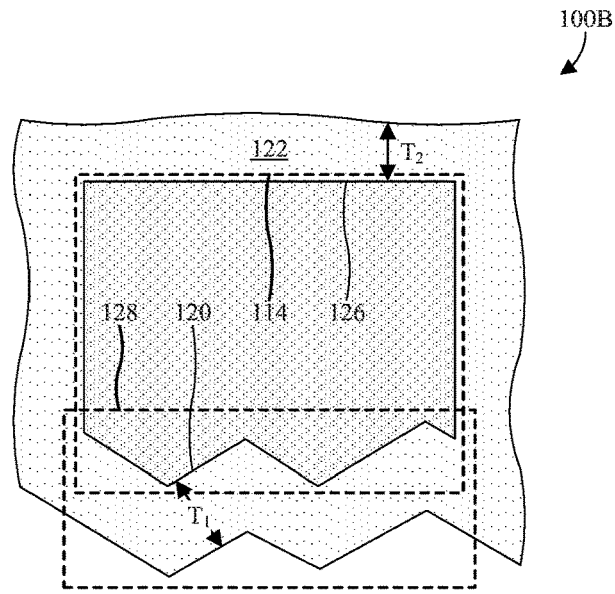
FIG. 1B illustrates an enlarged cross-sectional view of some embodiments of a movable element in the MEMS package of FIG. 1A.

With reference to FIG. 1B, an enlarged cross-sectional view 100B of some embodiments of the movable element lower surface 120 is provided. As illustrated, a surface area of the movable element lower surface 120 is greater than an upper surface 126 of the movable element 114, even though the movable element upper surface 126 and the movable element lower surface 120 share a common footprint. This is because the movable element lower surface 120 is rough and spans three-dimensions, whereas the movable element upper surface 126 is substantially planar and restricted to two dimensions. Where the anti-stiction layer 122 is formed by FDTS, the increased surface area of the movable element lower surface 120 increases the quality of a region 128 of the anti-stiction layer 122 on the movable element lower surface 120 relative to other regions of the anti-stiction layer 122. For example, a thickness $T_1$ of the anti-stiction layer 122 on the movable element lower surface 120 may be substantially uniform, whereas a thickness $T_2$ of the anti-stiction layer 122 on the movable element upper surface 126 may be substantially non-uniform.

While the movable element 114 is illustrated and described as being suspended within the cavity 116 between the support and capping devices 104, 106, the capping device 106 may be omitted and the movable element 114 may be a flexible membrane covering the cavity 116 in other embodiments. In such embodiments, the movable element 114 defines an upper surface of the cavity 116 and configured to deflect in proportion to external stimuli, such as pressure. Such a configuration may, for example, be used for sensing a pressure difference between the cavity 116 and an external environment of the MEMS package.

Figure 2A:
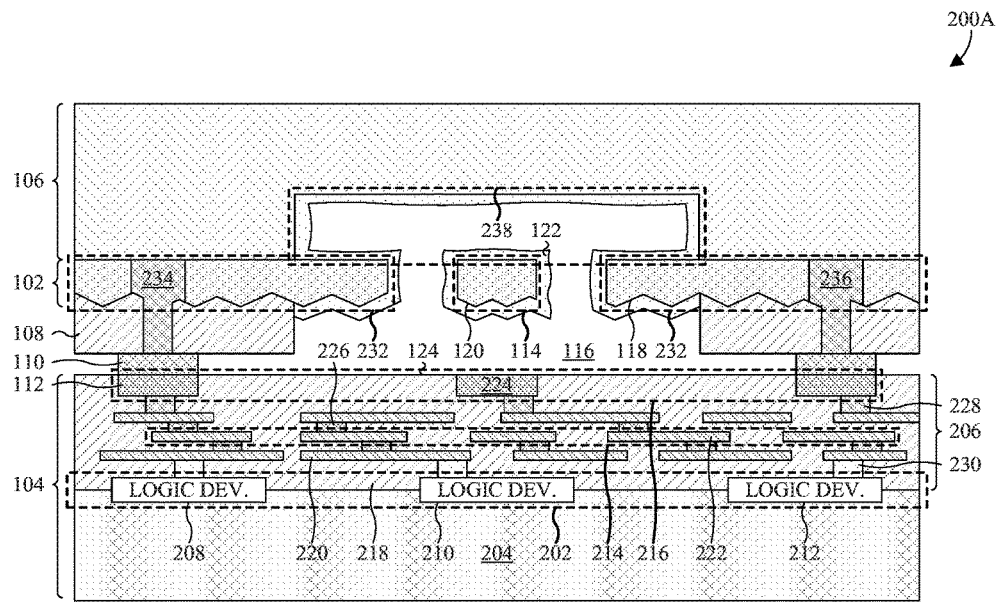
FIG. 2A illustrates a cross-sectional view of some more detailed embodiments of the MEMS package of FIG. 1A.

With reference to FIG. 2A, a cross-sectional view 200A of some more detailed embodiments of the MEMS package of FIG. 1A is provided. As illustrated, a support device 104 comprises a device region 202 arranged on an upper surface of a support substrate 204, and an interconnect structure 206 covering the device region 202 and the support substrate 204. The device region 202 comprises electronic devices 208, 210, 212, such as transistors, photodiodes, memory cells, etc. The support substrate 204 may be, for example, a bulk semiconductor substrate, such as a bulk silicon substrate, or a silicon-on-insulator (SOI) substrate.

The interconnect structure 206 interconnects the electronic devices 208, 210, 212 in the device region 202. A stack of conductive layers 214, 216 (only two of which are labeled) are arranged within a dielectric region 218 comprising multiple inter-layer dielectric (ILD) layers and a passivation layer. The conductive layers 214, 216 comprise individual features 220, 222 (only some of which are labeled), such as lines and pads, and a topmost conductive layer 216 comprises a support bond ring 112 and a fixed sensing electrode 224. The support bond ring 112 extends laterally to enclose a cavity 116 overlying the support device 104, and the fixed sensing electrode 224 is arranged under the cavity 116. Vias 226, 228 (only some of which are labeled) are arranged in the dielectric region 218, between the conductive layers 214, 216, to interconnect the conductive layers 214, 216. Similarly, contacts 230 (only one of which is labeled) are arranged in the dielectric region 218, between a bottommost conductive layer (not labeled) and the device region 202, to connect the device region 202 to the bottommost conductive layer. The conductive layers 214, 216, the vias 226, 228, and the contacts 230 may be, for example, a metal, such as copper, aluminum copper, or tungsten, or some other conductive material. The dielectric region 218 may be or otherwise include, for example, an oxide, a low κ dielectric (i.e., a dielectric with a dielectric constant less than about 3.9), or some other dielectric material.

An ISD layer 108 and a device bond ring 110 are stacked over the support device 104, between the support device 104 and a MEMS device substrate 102. The ISD layer 108 and the device bond ring 110 laterally enclose the cavity 116 and bond the MEMS device substrate 102 to the support device 104 at an interface between the support bond ring 112 and the device bond ring 110. The ISD layer 108 is arranged over the device bond ring 110, between the device bond ring 110 and the MEMS device substrate 102. The ISD layer 108 may be, for example, a thermal oxide or some other dielectric material. The device bond ring 110 underlies the ISD layer 108 and interfaces with the support bond ring 112. In some embodiments, the device bond ring 110 interfaces with the support bond ring 112 at a eutectic bond. Further, the device bond ring 110 overlaps with the support bond ring 112 and has a ring-shaped footprint of similar or equal size (e.g., in terms of area) as that of the support bond ring 112. The device bond ring 110 may be, for example, germanium or some other conductive material.

The MEMS device substrate 102 is arranged over and bonded to the support device 104 through the ISD layer 108 and the device bond ring 110. The MEMS device substrate 102 comprises a fixed region 232 and a movable element 114 (i.e., a movable region), and may be, for example, a bulk semiconductor substrate, such as a monocrystalline silicon substrate. The fixed region 232 corresponds to regions of the MEMS device substrate 102 that are fixed relative to the movable element 114. The movable element 114 corresponds to a region of the MEMS device substrate 102 that is suspended within the cavity 116, over the fixed sensing electrode 224, and is configured to move within the cavity 116 in proportion to external stimuli, such as acceleration. The movable element 114 is suspended by one or more cantilever beams or springs (not shown) that connect the movable element 114 to the fixed region 232. Further, the movable element 114 comprises a movable sensing electrode (not shown) that is electrically coupled to the support device 104 by through substrate vias (TSVs) 234, 236 extending through the MEMS device substrate 102 and the ISD dielectric layer 108 to, for example, the device bond ring 110. The TSVs 234, 236 may, for example, comprise a metal or some other conductive material.

A capping device 106 is arranged over and bonded to the MEMS device substrate 102. In some embodiments, the capping device 106 is bonded to the MEMS device substrate 102 by a fusion bond or hybrid bond at an interface between the capping device 106 and the MEMS device substrate 102. The hybrid bond may, for example, comprise a bond interface between dielectric materials and a bond interface between some other materials, such as metals. The capping device 106 defines an upper surface of the cavity 116 and, in some embodiments, comprises a lower recess 238 defining an upper region of the cavity 116. The capping device 106 may be, for example, IC or a bulk semiconductor substrate, such as a bulk silicon substrate.

An anti-stiction layer 122 lines a lower surface 118 of the MEMS device substrate 102, including a lower surface 120 of the movable element 114. The MEMS device lower surface 118 and the movable element lower surface 120 are rough and may have, for example, a saw tooth profile with teeth of varying size. Further, the anti-stiction layer 122 lines other surfaces of the MEMS device substrate 102 and the capping device 106 within the cavity 116, such as, for example, the lower recess 238 of the capping device 106. The anti-stiction layer 122 is a material configured to reduce stiction between the movable element 114 and surface of the cavity 116. The anti-stiction layer 122 may be, for example, a FDTS monolayer or some other self-assembled monolayer (SAM). The FDTS monolayer results from a reaction between FDTS and hydroxide on surfaces of the MEMS device substrate 102 and the capping device 106.

In operation, the movable element 114 moves within the cavity 116 in proportion to external stimuli, such as acceleration. For example, as the MEMS package is accelerated, the movable element 114 moves within the cavity 116 in proportion to the acceleration. Capacitive coupling between the fixed sensing electrode 224 and the movable sensing electrode (not shown) is then used to measure the movement of the movable element 114 and to indirectly measure the external stimuli.

In some instances, the movable element 114 may move beyond limits and interface with surfaces of the cavity 116, thereby opening up the possibility of stiction between the movable element 114 and the surfaces. However, due to the anti-stiction layer 122 and the roughness on the MEMS device lower surface 118, there is advantageously a low likelihood of stiction. The roughness minimizes the amount of surface area on the movable element lower surface 120 that can come into contact with an upper surface 124 of the support device 104. Further, where the anti-stiction layer 122 is the FDTS monolayer, the roughness on the movable element lower surface 120 increases the quality of the anti-stiction layer 122 on the movable element lower surface 120 since the quality is dependent upon the amount of surface area on the movable element lower surface 120 and the roughness increases surface area.

Figure 2B:
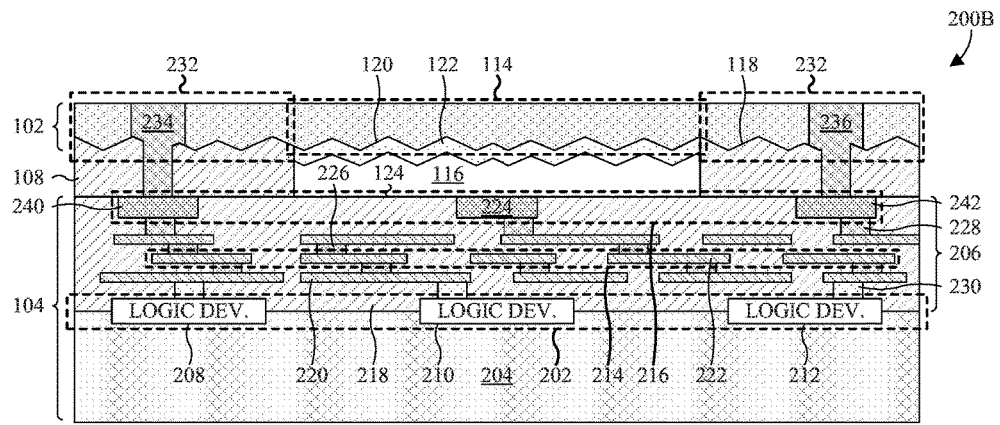
FIG. 2B illustrates a cross-sectional view of other more detailed embodiments of the MEMS package of FIG. 1A.

With reference to FIG. 2B, a cross-sectional view 200B of other more detailed embodiments of the MEMS package of FIG. 1A. As illustrated, the capping device 106 (see FIG. 2A) is omitted. Further, the movable element 114 is a flexible membrane defining an upper surface of the cavity 116 and is configured to deflect in proportion to external stimuli, such as pressure. Even more, in some embodiments, the support device 104 is bonded to the MEMS device substrate 102 by fusion bonding and/or electrically coupled to the MEMS device substrate 102 by bond pads 240, 242 of the support device 104.

While the position of the movable element 114 is illustrated and described as being determined by capacitive coupling between sensing electrodes in FIGS. 2A and 2B, other approaches may be employed to sense the position of the movable element 114 within the cavity 116. For example, optical approaches may be employed to sense the position of the movable element 114 with the cavity 116.

With reference to FIGS. 3-10, a series of cross-sectional views of some embodiments of a method for manufacturing a MEMS package with roughness for high quality anti-stiction is provided. The cross-sectional views may, for example, correspond to the MEMS package of FIG. 1A at various stages of manufacture.

Figure 3:
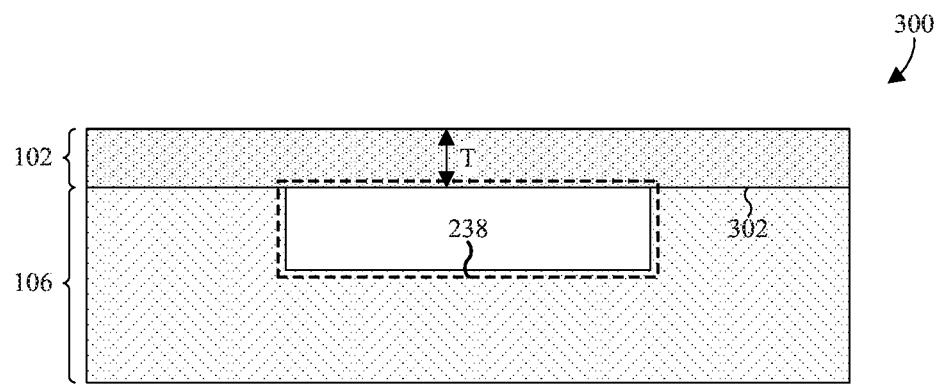
FIGS. 3-10 illustrate a series of cross-sectional views of some embodiments of a method for manufacturing a MEMS package with roughness for high quality anti-stiction.

As illustrated by the cross-sectional view 300 of FIG. 3, a MEMS device substrate 102 is arranged over and bonded to a capping device 106. In some embodiments, the MEMS device substrate 102 and the capping device 106 are bonded by a fusion bond at an interface 302 between the MEMS device substrate 102 and the capping device 106. The MEMS device substrate 102 and the capping device 106 may be, for example, a bulk semiconductor substrate, such as a bulk monocrystalline silicon substrate. The capping device 106 comprises a recess 238 arranged on an upper side of the capping device 106, between the capping device 106 and the MEMS device substrate 102. In some embodiments, the recess 238 is formed by photolithography (not shown) before bonding the capping device 106 and the MEMS device substrate 102 together. For example, a photoresist layer may be formed and patterned on the capping device 106. An etchant may then be applied to the capping device 106 while the photoresist layer selectively masks the capping device.

Also illustrated by the cross-sectional view 300 of FIG. 3, the MEMS device substrate 102 is thinned to a desired thickness T. In some embodiments, the MEMS device substrate 102 is thinned by a chemical mechanical polish (CMP) and/or an etch back.

Figure 4:
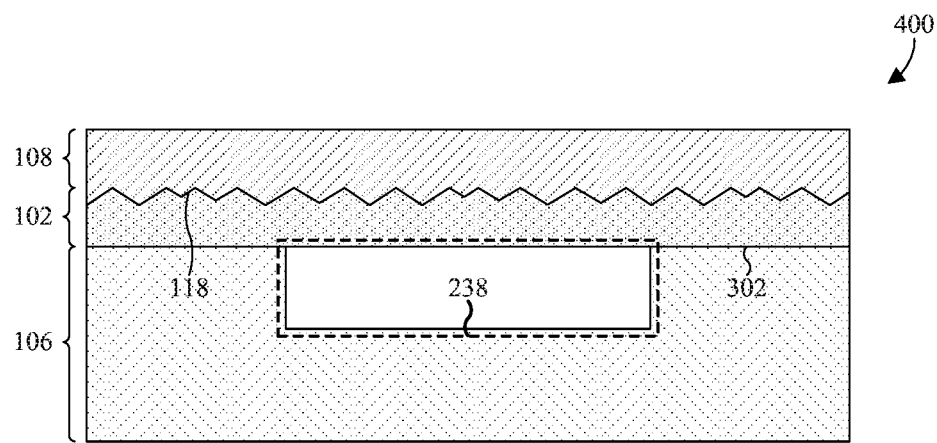

As illustrated by the cross-sectional view 400 of FIG. 4, an ISD layer 108 is formed over the MEMS device substrate 102. The ISD layer 108 is an oxide, such as silicon dioxide, and is formed by thermal oxidation. In performing the thermal oxidation, regions of the MEMS device substrate 102 neighboring the ISD layer 108 are consumed and converted to the ISD layer 108 by a reaction between an oxidizing agent and the MEMS device substrate 102. The oxidizing agent is introduced into an environment of the MEMS device substrate 102 and diffuses into the MEMS device substrate 102 to react with the MEMS device substrate 102. The oxidizing agent may be, for example, water vapor or molecular oxygen, and is introduced at high temperature (e.g., between about 800-1200 degrees Celsius). The reaction results in a surface 118 of the MEMS device substrate 102 that is rough. For example, the surface 118 of the MEMS device substrate 102 may have a saw tooth profile with teeth of varying size. As such, the MEMS device substrate 102 may, for example, also be referred to as a rough layer.

Figure 5:
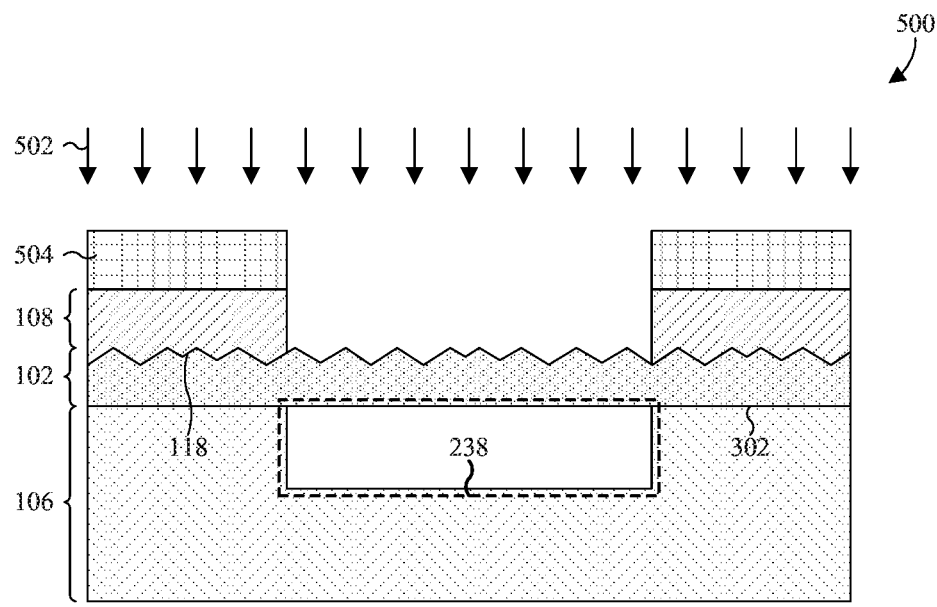

As illustrated by the cross-sectional view 500 of FIG. 5, a first etch is performed into the ISD layer 108 to remove a region of the ISD layer 108 that overlies the recess 238 of the capping device 106 (i.e., to form an opening). In some embodiments, the region is restricted to directly over the recess 238. By removing the region of the ISD layer 108 overlying the recess 238, the rough surface 118 of the MEMS device substrate 102 is partially exposed.

In some embodiments, the process for performing the first etch comprises depositing and patterning a first photoresist layer over the ISD layer 108. For example, the first photoresist layer may be patterned to mask regions of the ISD layer 108 that laterally surround the recess 238. The patterning may advantageously be performed with a same photolithographic mask used to form the recess 238, such that no additional masks may be needed to pattern the photoresist layer. Thereafter, one or more etchants 502, such as wet or dry etchants, are applied to the ISD layer 108 while using the first patterned photoresist layer 504 as a mask. After performing the first etch, the first patterned photoresist layer 504 is removed or otherwise stripped.

Figure 6:
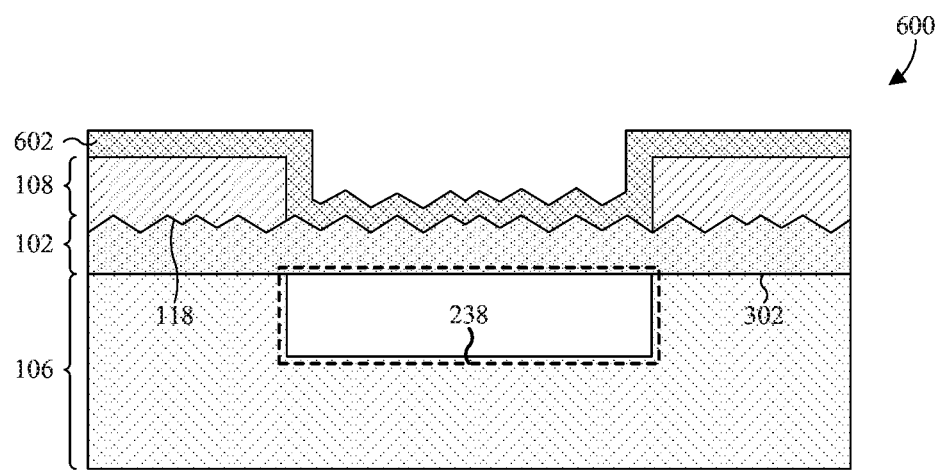

As illustrated by the cross-sectional view 600 of FIG. 6, a bond ring layer 602 is formed over the ISD layer 108 and the MEMS device substrate 102. The bond ring layer 602 may be formed of, for example, germanium or some other material capable of eutectic bonding. In some embodiments, the bond ring layer 602 is formed using a vapor deposition technique, such as chemical vapor or physical vapor deposition, or atomic layer deposition.

Figure 7:
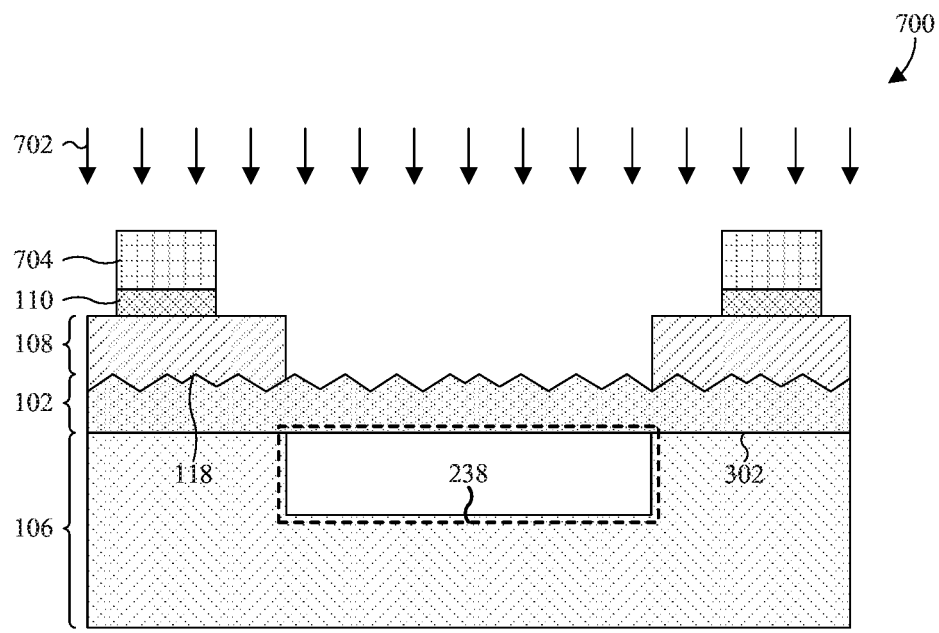

As illustrated by the cross-sectional view 700 of FIG. 7, a second etch is performed into the bond ring layer 602 (see FIG. 6) to form a device bond ring 110 laterally enclosing the recess 238. In some embodiments, the process for performing the second etch comprises depositing and patterning a second photoresist layer over the bond ring layer 602. For example, the second photoresist layer may be patterned to mask regions of the bond ring layer 602 that correspond to the device bond ring 110. Thereafter, one or more etchants 702, such as wet or dry etchants, are applied to the bond ring layer 602 while using the second patterned photoresist layer 704 as a mask. After performing the second etch, the patterned photoresist layer 704 is removed or otherwise stripped.

Figure 8:
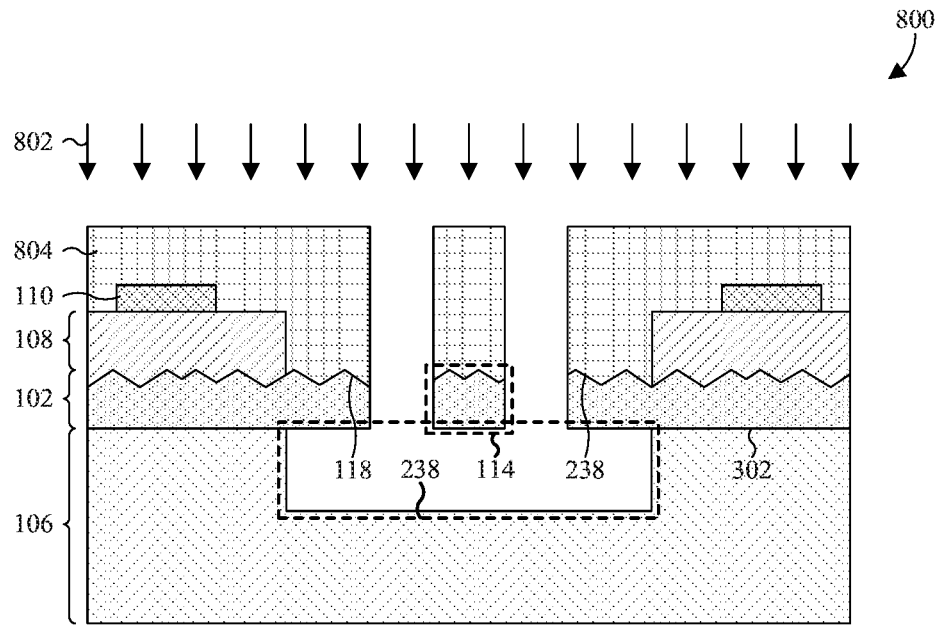

As illustrated by the cross-sectional view 800 of FIG. 8, a third etch is performed into the MEMS device substrate 102 to form a movable element 114 over the recess 238. In some embodiments, the process for performing the third etch comprises depositing and patterning a third photoresist layer over ISD layer 108 and the MEMS device substrate 102. For example, the third photoresist layer may be patterned to mask regions of the MEMS device substrate 102 that correspond to the movable element 114 and regions of the MEMS device substrate 102 and the ISD layer 108 laterally surrounding the recess 238. Thereafter, one or more etchants 802, such as wet or dry etchants, are applied to the MEMS device substrate 102 while using the third patterned photoresist layer 804 as a mask. After performing the third etch, the third patterned photoresist layer 804 is removed or otherwise stripped.

Figure 9:
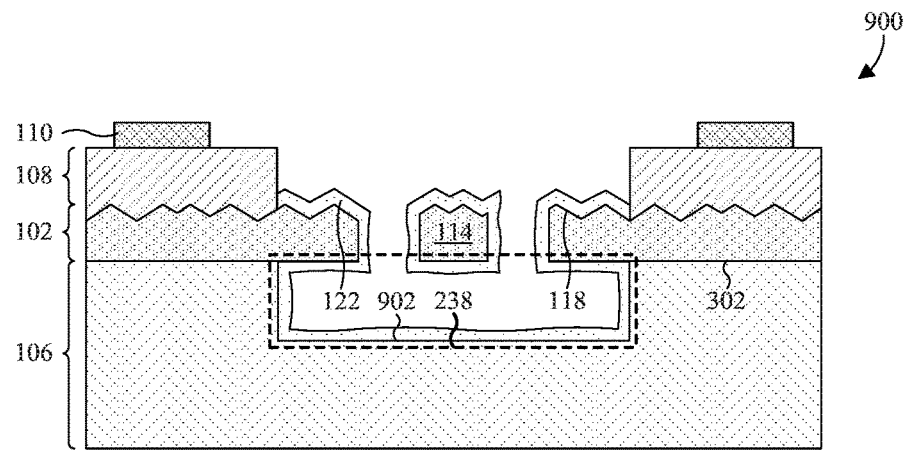

As illustrated by the cross-sectional view 900 of FIG. 9, an anti-stiction layer 122 is formed lining surfaces 902 (only one of which is labeled) of the recess 238 and surfaces of the MEMS device substrate 102 overlying the recess 238, such as portions of the rough surface 118 overlying the recess 238. In some embodiments, the anti-stiction layer 122 is formed by exposing the surfaces to FDTS. The FDTS may, for example, be exposed to the surfaces in the absence of heat and without plasma. The FDTS reacts with hydroxyl (—OH) groups on the surfaces to terminate dangling bonds of the surfaces and to covalently bond to the surfaces. The FDTS reacts and covalently bonds to form the anti-stiction layer 122 as a FDTS monolayer that is self-aligned due to van der Waals intermolecular forces. Advantageously, because the surface area of the rough surface 118 is greater than flat surfaces, the quality of the anti-stiction layer 122 is greater (e.g., more uniform) on the rough surface 118 than on other surfaces.

The FDTS reaction is dependent upon hydroxyl (—OH) groups on the surfaces.

Therefore, in some embodiments, the surfaces are hydrolyzed prior to forming the anti-stiction layer 122. Hydrolysis may include the application of purified water, such as deionized or distilled water, to the surfaces. Further, hydrolysis may be enhanced by an acid or a base. In some embodiments, hydrolysis comprises treating the surfaces with an acidic solution. For example, the surfaces may be treated with a solution comprising hydrofluoric acid, such as dilute hydrofluoric acid (DHA) or buffer oxide etch (BOE).

Figure 10:
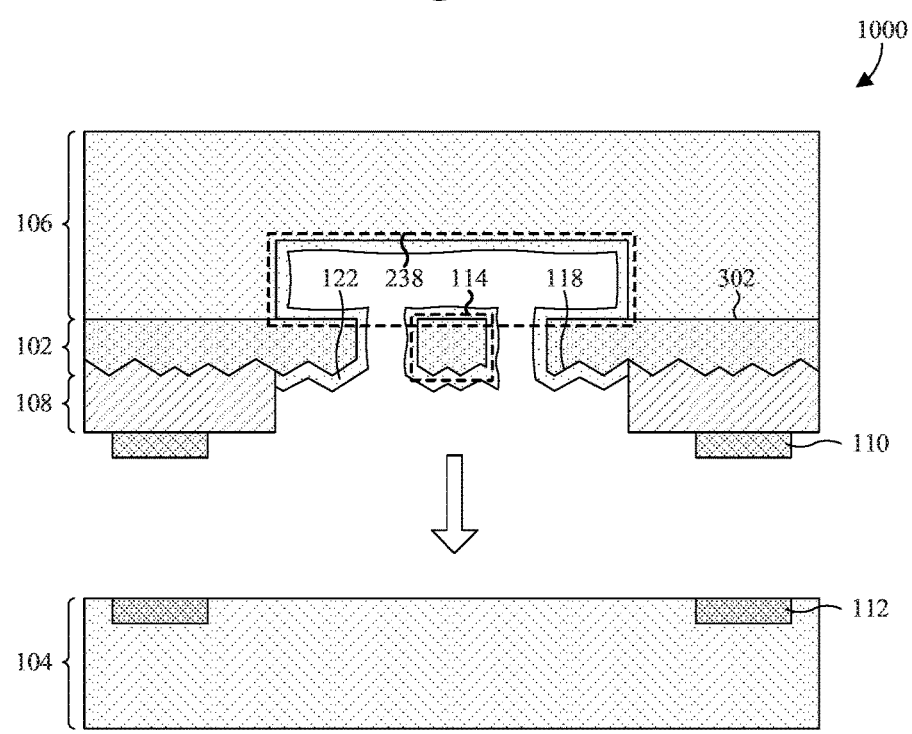

As illustrated by the cross-sectional view 1000 of FIG. 10, MEMS device substrate 102 and the capping device 106 are rotated 180 degrees and bonded to a support device 104. The support device 104 may be, for example, an IC or a bulk semiconductor substrate. In some embodiments, the MEMS device substrate 102 is eutectically bonded to the support device 104 through a support bond ring 112 of the support device 104. The support bond ring 112 has the same or a similar footprint as the device bond ring 110, and may be, for example, aluminum copper or some other material capable of eutectic bonding.

Figure 11:
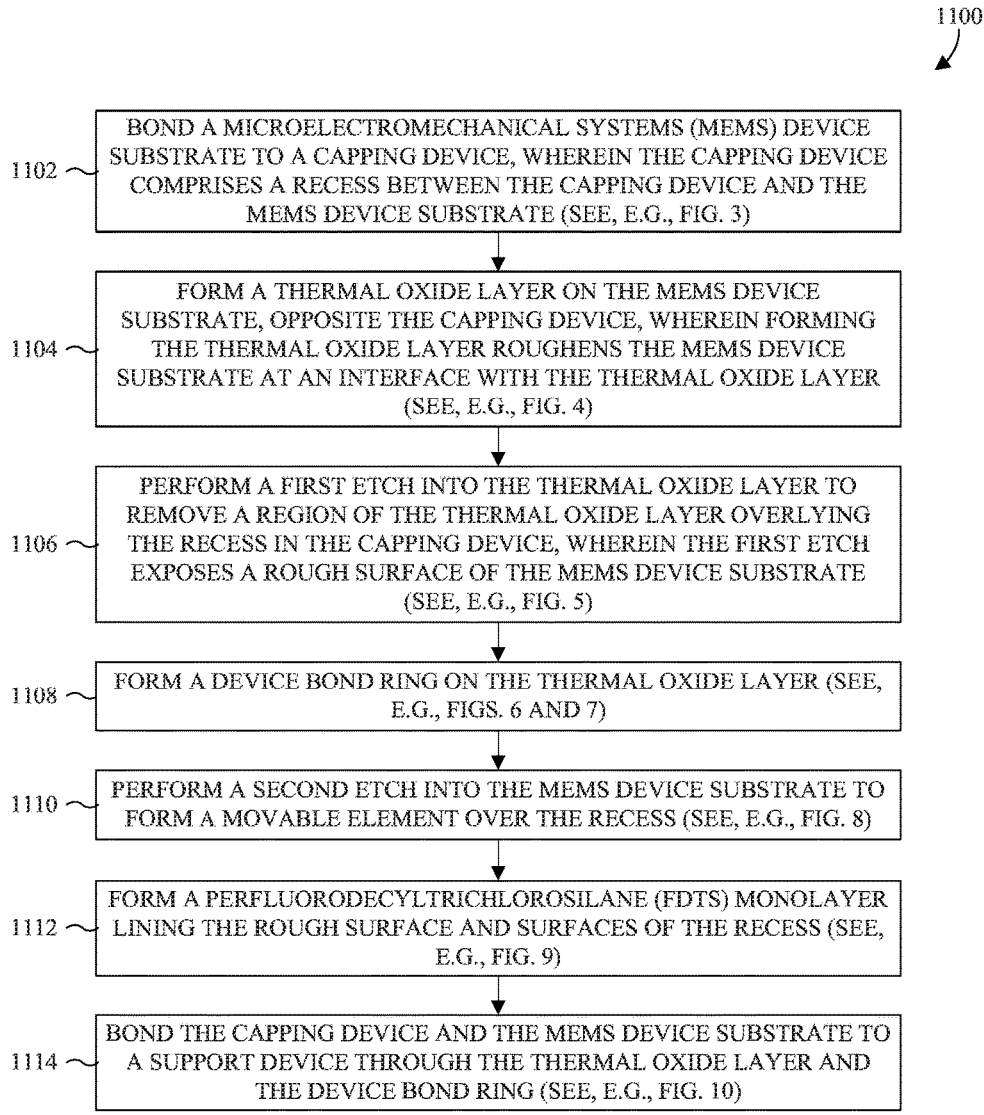
FIG. 11 illustrates a flowchart of some embodiments of a method for manufacturing a MEMS package with roughness for high quality anti-stiction.

With reference to FIG. 11, a flowchart 1100 of some embodiments of a method for manufacturing a MEMS package with roughness for a high quality anti-stiction layer is provided.

At 1102, MEMS device substrate is bonded to a capping device. The capping device comprises a recess between the capping device and the MEMS device substrate. See, for example, FIG. 3.

At 1104, a thermal oxide layer is formed on the MEMS device substrate, opposite the capping device. Forming the thermal oxide layer roughens the MEMS device substrate at an interface with the thermal oxide layer. See, for example, FIG. 4.

At 1106, a first etch is performed into the thermal oxide layer to remove a region of the thermal oxide layer overlying the recess in the capping device. The first etch exposes a rough surface of the MEMS device substrate. See, for example, FIG. 5.

At 1108, a device bond ring is formed on the thermal oxide layer. See, for example, FIGS. 6 and 7.

At 1110, a second etch is performed into the MEMS device substrate to form a movable element over the recess. See, for example, FIG. 8.

At 1112, an FDTS monolayer is formed lining the rough surface and surfaces of the recess. See, for example, FIG. 9.

At 1114, the capping device and the MEMS device substrate are bonded to a support device through the thermal oxide layer. See, for example, FIG. 10.

Advantageously, the method may be performed without affecting the bond quality between the MEMS device substrate and the capping device. Further, the method adds no additional masks, which advantageously keeps costs low. Even more, the method advantageously achieves low stiction between the movable element and the support device.

While the flowchart 1100 is directed to the MEMS package of FIG. 1A and FIG. 2A, Acts 1102, 1108, and 1110 may be omitted in other embodiments to form a MEMS package according to the embodiments of FIG. 2B. Further, while the method described by the flowchart 1100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides a MEMS package. A device substrate is arranged over a support device. The device substrate comprises a movable element with a lower surface that is rough and that is arranged within a cavity. A dielectric layer is arranged between the support device and the device substrate. The dielectric layer laterally encloses the cavity. An anti-stiction layer lines the lower surface of the movable element.

In other embodiments, the present disclosure provides a method for manufacturing a MEMS package. A thermal oxide layer is formed on a surface of a device substrate. Forming the thermal oxide layer roughens the surface of the device substrate. An etch is performed into the thermal oxide layer to form an opening partially exposing the surface of the device substrate. An anti-stiction layer is formed lining the partially-exposed surface of the device substrate. The device substrate is bonded to a support device through the thermal oxide layer to seal a cavity overlying the support device.

In yet other embodiments, the present disclosure provides a MEMS package. A capping device is arranged over a support device. A device substrate is arranged between the support and capping devices. The device substrate comprises a movable element arranged within a cavity between the support and capping devices. A lower surface of the movable element is rough. A dielectric layer is arranged between the support device and the device substrate. The dielectric layer laterally encloses the cavity. An anti-stiction layer lines the lower surface of the movable element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package comprising:
    a device substrate arranged over a support device, wherein the device substrate comprises a movable element with a lower surface that has peaks and valleys and that is arranged within a cavity;
    a dielectric layer arranged between the support device and the device substrate, wherein the dielectric layer laterally encloses the cavity;
    a conductive via extending through the dielectric layer and the device substrate, from a bottom of the dielectric layer to a top of the device substrate, wherein a first lower surface portion of the device substrate and an upper surface of the dielectric layer directly contact each other at a first interface, and the first interface has a first profile of peaks and valleys, continuously from the conductive via to a sidewall of the cavity, wherein a second lower surface portion of the device substrate defines the lower surface of the movable element and is spaced from the dielectric layer, and wherein a lower surface of the conductive via overlies and conforms to the upper surface of the dielectric layer at a second interface having a second profile of peaks and valleys; and
    an anti-stiction layer lining the lower surface of the movable element.

2. The MEMS package according to claim 1, further comprising:
    a capping device arranged over the device substrate and defining an upper surface of the cavity, wherein the movable element is suspended with the cavity.

3. The MEMS package according to claim 2, wherein the cavity comprises a recess on a lower side of the capping device, and wherein the anti-stiction layer lines the recess on the lower side of the capping device.

4. The MEMS package according to claim 1, wherein the dielectric layer is a thermal oxide layer, and wherein the device substrate is monocrystalline silicon.

5. The MEMS package according to claim 1, wherein the movable element is configured to move within the cavity in proportion to external stimuli.

6. The MEMS package according to claim 1, wherein the anti-stiction layer is a perfluorodecyltrichlorosilane (FDTS) monolayer.

7. The MEMS package according to claim 1, wherein a region of the anti-stiction layer lining the lower surface of the movable element has a substantially uniform thickness, whereas another region of the anti-stiction layer overlying the region has a substantially non-uniform thickness.

8. The MEMS package according to claim 1, wherein the support device comprises an interconnect structure, wherein the interconnect structure comprises an interlayer dielectric (ILD) layer and a stack of conductive features within the ILD layer, and wherein a top surface of the interconnect structure is uncovered by the anti-stiction layer and exposed directly to the cavity.

9. A microelectromechanical systems (MEMS) package comprising:
    a support device comprising an interconnect structure, wherein the interconnect structure comprises an interlayer dielectric (ILD) layer and a stack of conductive features within the ILD layer;
    a capping device arranged over the support device;
    a device substrate arranged between the support and capping devices, wherein the device substrate comprises a movable element arranged within a cavity between the support and capping devices, wherein a first lower surface portion of the device substrate defines a plurality of first protrusions, wherein a second lower surface portion of the device substrate defines a lower surface of the movable element, and wherein the lower surface of the movable element defines a plurality of second protrusions;

a dielectric layer arranged over and bonded to the interconnect structure, and between the support device and the device substrate, wherein the dielectric layer laterally encloses the cavity, wherein the dielectric layer has an upper surface defining a plurality of recesses, wherein each recess of the plurality of recesses underlies and directly contacts a corresponding one of the first protrusions, and wherein each recess of the plurality of recesses has a profile matching a profile of the corresponding one of the first protrusions;

an anti-stiction layer lining the lower surface of the movable element; and a pair of conductive pads stacked between the dielectric layer and the support device, wherein the conductive pads comprises a top conductive pad and a bottom conductive pad, wherein the top and bottom conductive pads directly contact at a eutectic bond interface, wherein the top conductive pad spaces the dielectric layer over the interconnect structure, such that the dielectric layer overhangs the interconnect structure and the cavity is directly between the interconnect structure and an overhanging portion of the dielectric layer, wherein the top conductive pad is in direct fluid communication with the cavity and extends continuously from the eutectic bond interface to a bottommost surface of the dielectric layer, wherein the top conductive pad comprises a pair of segments, and wherein the segments are respectively on opposite sides of the cavity and define sidewalls of the cavity.

10. The MEMS package according to claim 9, wherein the dielectric layer has a pair of inner sidewalls in the cavity and respectively on the opposite sides of the cavity, wherein the dielectric layer has a pair of outer sidewalls outside of the cavity and respectively on the opposite sides, wherein the inner sidewalls are spaced between the outer sidewalls, and wherein the upper surface of the dielectric layer and the first lower surface portion of the device substrate directly contact each other, and have individual saw-toothed profiles, continuously from each of the outer sidewalls to a corresponding one of the inner sidewalls on a same side of the cavity as the outer sidewall.

11. The MEMS package according to claim 10, further comprising:

a through substrate via (TSV) extending through the device substrate and the dielectric layer to electrically couple with the interconnect structure, wherein the first lower surface portion of the device substrate and the upper surface of the dielectric layer directly contact each other, and respectively have a first saw toothed profile and a second saw toothed profile, continuously from the TSV to a sidewall of the pair of inner sidewalls of the dielectric layer in the cavity.

12. The MEMS package according to claim 9, wherein the capping device comprises a bottom recess that partially defines the cavity and that is directly over the movable element.

13. The MEMS package according to claim 9, wherein the anti-stiction layer extends continuously from a first sidewall of the anti-stiction layer to a second sidewall of the anti-stiction layer, wherein the first and second sidewalls of the anti-stiction layer respectively contact opposite sidewalls of the cavity, wherein the anti-stiction layer contacts top and bottom surfaces of the device substrate, a sidewall of the device substrate, and the capping device while extending continuously from the first sidewall of the anti-stiction layer to the second sidewall of the anti-stiction layer.

14. The MEMS package according to claim 9, wherein the anti-stiction layer has a ring-shaped profile encircling and contacting the movable element, and wherein a bottom surface of the anti-stiction layer defines a plurality of third protrusions.

15. The MEMS package according to claim 9, further comprising:

a conductive via extending through the dielectric layer and the device substrate, from a bottom of the dielectric layer to a top of the device substrate, wherein a lower surface of the conductive via overlies and directly contacts the upper surface of the dielectric layer, and wherein the lower surface of the conductive via conforms to the plurality of recesses.

16. A microelectromechanical systems (MEMS) package comprising:

a first semiconductor substrate;

an interconnect structure on the first semiconductor substrate, wherein the interconnect structure comprises an interlayer dielectric (ILD) layer and a stack of conductive features within the ILD layer;

a device layer in the first semiconductor substrate, between the first semiconductor substrate and the interconnect structure;

an inter-substrate dielectric (ISD) layer over and bonded to the interconnect structure, wherein the ISD layer comprises a cavity and is silicon dioxide, wherein the ISD layer has a pair of inner opposite sidewalls in the cavity, wherein the ISD layer has a pair of outer opposite sidewalls outside of the cavity, and wherein the inner opposite sidewalls are spaced between the outer opposite sidewalls;

a second semiconductor substrate covering and contacting the ISD layer, wherein the second semiconductor substrate comprises a movable element within the cavity, wherein a lower surface of the movable element has a first saw toothed profile, wherein the second semiconductor substrate is a bulk substrate of monocrystalline silicon, and wherein a bottom of the second semiconductor substrate has a sawtooth shape, and extends continuously from one of the outer opposite sidewalls to another one of the outer opposite sidewalls, when viewed in profile;

a through substrate via (TSV) extending through the second semiconductor substrate and the ISD layer to electrically couple with the interconnect structure, wherein a lower surface of the second semiconductor substrate and an upper surface of the ISD layer directly contact each other, and respectively have a second saw toothed profile and a third saw toothed profile, continuously from the TSV to a sidewall of the pair of inner opposite sidewalls of the ISD layer in the cavity, and wherein the lower surface of the second semiconductor substrate includes the lower surface of the movable element; and an anti-stiction layer lining and contacting the movable element, wherein a top surface of the interconnect structure is uncovered by the anti-stiction layer and exposed directly to the cavity.

17. The MEMS package according to claim 16, further comprising:

a capping device covering and bonded to the second semiconductor substrate, wherein the capping device comprises a bottom recess partially defining the cavity and lined by the anti-stiction layer.

18. The MEMS package according to claim 16, wherein a lower surface of the TSV overhangs and directly contacts the upper surface of the ISD layer to define a TSV-ISD interface, and wherein the TSV-ISD interface has a fourth saw toothed profile adjacent to the second and third saw toothed profiles.

19. The MEMS package according to claim 16, further comprising:
 a conductive pad spacing the ISD layer over the interconnect structure, such that the ISD layer overhangs the interconnect structure and the cavity is directly between the interconnect structure and an overhanging portion of the ISD layer, wherein the conductive pad comprises a pair of segments, and wherein the segments are respectively on opposite sides of the cavity and define sidewalls of the cavity.

20. The MEMS package according to claim 11, wherein the dielectric layer underlies and contacts the device substrate, wherein the dielectric layer is silicon dioxide, and wherein the device substrate is a bulk monocrystalline silicon substrate.

* * * * *